(12) United States Patent
Ni

(10) Patent No.: US 7,821,277 B2
(45) Date of Patent: Oct. 26, 2010

(54) PARALLEL TEST FIXTURE FOR MIXED SIGNAL INTEGRATED CIRCUITS

(75) Inventor: Cheng-Chin Ni, Taipei (TW)

(73) Assignee: King Yuan Electronics Co., Ltd., Hsin-Chu (TW)

( * ) Notice: Subject to any disclaimer, the term of this patent is extended or adjusted under 35 U.S.C. 154(b) by 248 days.

(21) Appl. No.: 12/144,529

(22) Filed: Jun. 23, 2008

(65) Prior Publication Data

US 2009/0260863 A1    Oct. 22, 2009

(30) Foreign Application Priority Data

Apr. 18, 2008    (TW) ............................. 97114234 A

(51) Int. Cl.
*G01R 31/02*    (2006.01)
(52) U.S. Cl. ..................... 324/754; 324/158.1
(58) Field of Classification Search .............. None
See application file for complete search history.

(56) References Cited

U.S. PATENT DOCUMENTS

| | | | |
|---|---|---|---|
| 4,996,478 A * | 2/1991 | Pope ........................... 324/754 |
| 5,068,602 A * | 11/1991 | Mielke ......................... 324/755 |
| 6,420,888 B1 * | 7/2002 | Griffin et al. ................. 324/754 |

* cited by examiner

*Primary Examiner*—Minh N Tang
(74) *Attorney, Agent, or Firm*—Squire, Sanders & Dempsey, L.L.P.

(57) ABSTRACT

The present invention provides a parallel test fixture for mixed signal integrated circuits (ICs). The fixture includes a multi-layer printed circuit board (PCB). The fixture includes: a test area, which is disposed on a central area of the multi-layer PCB and includes several test regions for a plurality of mixed signal ICs; an analog signal ground layer, which is operationally connected with the analog signals of the mixed signal ICs in the test area; and a digital signal ground layer, which is operationally connected with the digital signals of the mixed signal ICs in the test area. Thereby, when a plurality of mixed signal ICs are parallel tested, not only the problem due to cross-talk could be solved but also the numbers of the layers of the multi-layer PCB could be reduced effectively.

11 Claims, 3 Drawing Sheets

PARALLEL TEST FIXTURE FOR MIXED SIGNAL INTEGRATED CIRCUITS

BACKGROUND OF THE INVENTION (1) Field of the Invention

The present invention relates to a fixture for integrated circuit to test. More particularly, the present invention relates to a parallel test fixture for mixed signal integrated circuits.

(2) Prior Art

Generally speaking, the various kinds of semiconductor integrated circuits (ICs) requiring such testing include analog signal ICs, digital signal ICs, and mixed signal ICs. Examples of analog signal ICs include amplifiers, voltage regulators, clock circuits, and phase lock loops. Digital signal ICs include high-speed very large scale integrated (VLSI) circuits such as microprocessors, microcontrollers, and digital signal processors, for example. Mixed signal ICs combine analog and digital functionality on a single semiconductor substrate or "chip," and mixed signal ICs are used in several areas such as communications (both wireless and wire-based) in which digital data elements are converted into analog signals which are eventually transmitted.

Usually, automatic test equipment (ATE) for testing ICs has a fixture for being an interface between the ATE and the ICs (or device under test (DUT)). The fixture is utilized to connect several pins of the ATE and the corresponding pins of the ICs for transferring signals. A test signal is provided by the ATE to the ICs through the fixture for testing, and a tested signal of the ICs is transferred back to the ATE for checking the quality of the ICs.

FIG. 1 shows a diagram of a traditional system for testing mixed signal IC. The test method comprises a test signal provided by an ATE 101 and the test signal is transferred to a fixture 102. Then, the test signal is transferred from the fixture 102 to a DUT. In this case, the DUT is a mixed signal IC 103. Because the DUT is a mixed signal IC 103, the test signal has to be divided to an analog signal and a digital signal by the fixture 102 when testing the mixed signal IC 103. Therefore, the test signal would be divided to an analog signal to connect the analog signal of the mixed signal IC 103 and a digital signal to connect the digital signal of the mixed signal IC 103 by the fixture 102 for testing. After testing, tested signals are a tested analog signal and a tested digital signal of the mixed signal IC 103 to the fixture 102. Then, these tested signals would be integrated by the fixture 102. The integrated tested signal would be transferred from the fixture 102 to the ATE 101 for analyzing.

Generally speaking, the fixture 102 is a multi-layer printed circuit board (PCB). Because the fixture 102 for testing mixed signal IC, the stacked pattern design of the multi-layer PCB comprises an analog signal layer for transferring analog signal and a digital signal layer for transferring digital signal. However, the analog signal layer and the digital signal layer have to share a ground layer if the multi-layer PCB only having a ground layer. Then, several problems such as crosstalk and noise between the analog signal and the digital signal would be occurred. For solving these problems, when designing stacked pattern of the multi-layer PCB, an analog signal ground layer for connecting the analog signal layer to form a circuit and a digital signal ground layer for connecting the digital signal layer to form a circuit would be considered. This means the problems about noise and crosstalk could be solved by dividing the analog signal with the digital signal when testing.

However, the fixture mentioned-above only could test one mixed signal IC at one time, and it's very uneconomic for today. But, the fixture mentioned-above for a plurality of mixed signal ICs to parallel test, the different analog signals of different mixed signal ICs would cause noise or crosstalk each other and the different digital signals of the different mixed signal ICs also would cause noise or crosstalk each other. In order to solve these problems, the usually solving method is to add the ground layers when designing the stacked pattern of the multi-layer PCB. Then, each analog signal of each mixed signal IC is connected to each analog signal ground layer, and each digital signal of each mixed signal IC is connected to each digital signal ground layer in the multi-layer PCB. For example, if a fixture for testing four the same mixed signal ICs at one time, the design of the stacked pattern of the multi-layer PCB has to comprise four analog signal ground layers and four digital signal ground layers for solving the problems about inaccurate test results due to noise and crosstalk between each signal.

As mentioned-above, the thickness of the multi-layer PCB would be added if the numbers of layer of the multi-layer PCB. When testing more numbers of mixed signal ICs at one time, the numbers of layer of the multi-layer PCB of the fixture have to be more. Then, the design of the stack pattern of the multi-layer PCB would be more difficult and complicated.

Therefore, it's needed to find a fixture, which is a fixture for mixed ICs to parallel test. Moreover, the fixture not only solves the problems of crosstalk but also reduces the numbers of ground layers of the multi-layer PCB.

SUMMARY OF THE INVENTION

An object of the present invention is to provide a layout of a multi-layer PCB of a fixture for solving the problems about crosstalk due to mixed signal ICs to parallel test and obtaining a better electricity of testing the mixed signal ICs.

Another object of the present invention is to provide a multi-layer PCB of a fixture for solving problems of crosstalk and reducing the numbers of layer of the multi-layer PCB by utilizing a sharing circuit deposition of the ground layer of the mixed signal ICs, which mixed signal ICs do not contact each other.

To achieve these objects mentioned above, the present invention provides a parallel test fixture for mixed signal IC, wherein said fixture having a multi-layer PCB, and said fixture comprising: a test area, which is disposed on a central area of the multi-layer PCB and includes several test regions for a plurality of mixed signal ICs; an analog signal ground layer, which is operationally connected with a plurality of analog signals of said mixed signal ICs in the test area; and a digital signal ground layer, which is operationally connected with a plurality of digital signals of said mixed signal ICs in the test area.

In the following description of the preferred embodiment, reference is made to the accompanying drawings which form a part hereof, and in which is shown by way of illustration a specific embodiment in which the invention may be practiced.

DETAILED DESCRIPTION OF THE INVENTION

Figure 1:
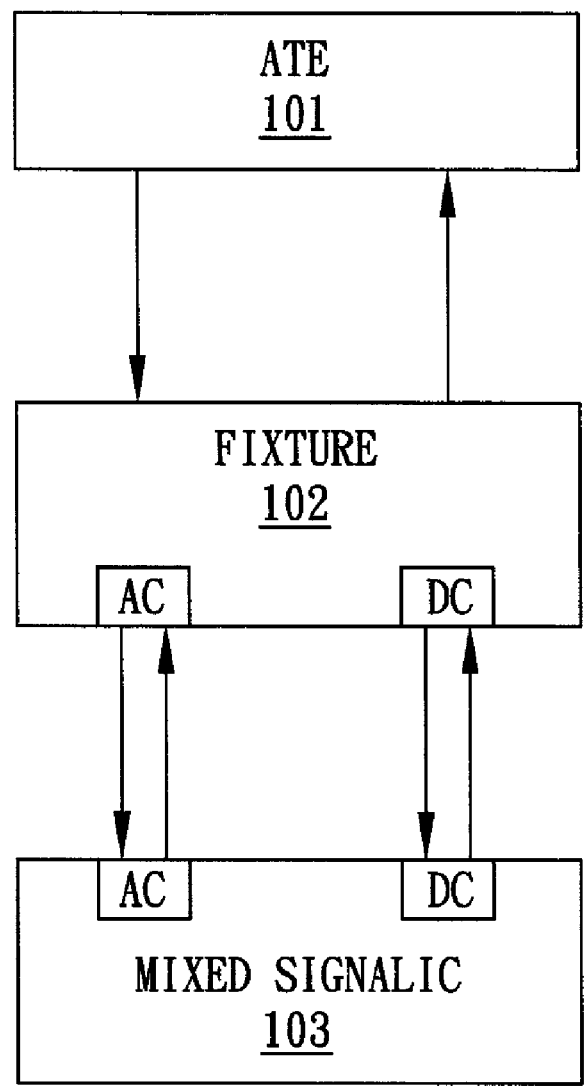
FIG. 1 shows a diagram of a traditional system for testing mixed signal IC.

Reference will now be made in detail to the presently preferred embodiments of the invention, examples of which are illustrated in the accompanying drawings. Wherever possible the same or similar reference numbers are used in the drawings and the description to refer to the same or like parts. It should be noted that the drawings are in simplified form and are not to precise scale. In reference to the disclosure herein for purposes of convenience and clarity only, directional terms, such as top, bottom, left, right, up, down, over, above, below, beneath, rear, front, vertical, horizontal, length, width, and height are used with respect to the accompanying drawings. Such directional terms should not be construed to limit the scope of the invention in any manner.

The parallel test method for mixed signal IC of the present invention is the same as the traditional method as shown in FIG. 1. However, the different between the traditional method and the present invention is the fixture. The fixture of the traditional method for solving the problems about crosstalk needs to add the numbers of ground layer of the multi-layer of the fixture, and it would cause that the design of stacked pattern of the multi-layer PCB becomes difficult and the thicknesses of multi-layer PCB also are added. Therefore, the present invention provides a circuit deposition of ground layers of a multi-layer PCB of a fixture that could solve the problems about crosstalk and reduce the numbers of ground layer.

The fixture of the present invention could be a load board or a probe card. The fixture comprises a multi-layer PCB. In this embodiment of the present invention, the multi-layer PCB has twenty layers. Furthermore, the multi-layer PCB comprises at least an analog signal layer for transferring analog signal, and at least a digital signal layer for transferring digital signal. The fixture further comprises a test area, which is for testing a plurality of mixed signal ICs, and the analog signal of the test area operationally connects to the analog signal layer; and the digital signal of the test area operationally connects to the digital signal layer. Moreover, the test area comprises several test regions for corresponding several mixed signal ICs to parallel test.

Figure 2:
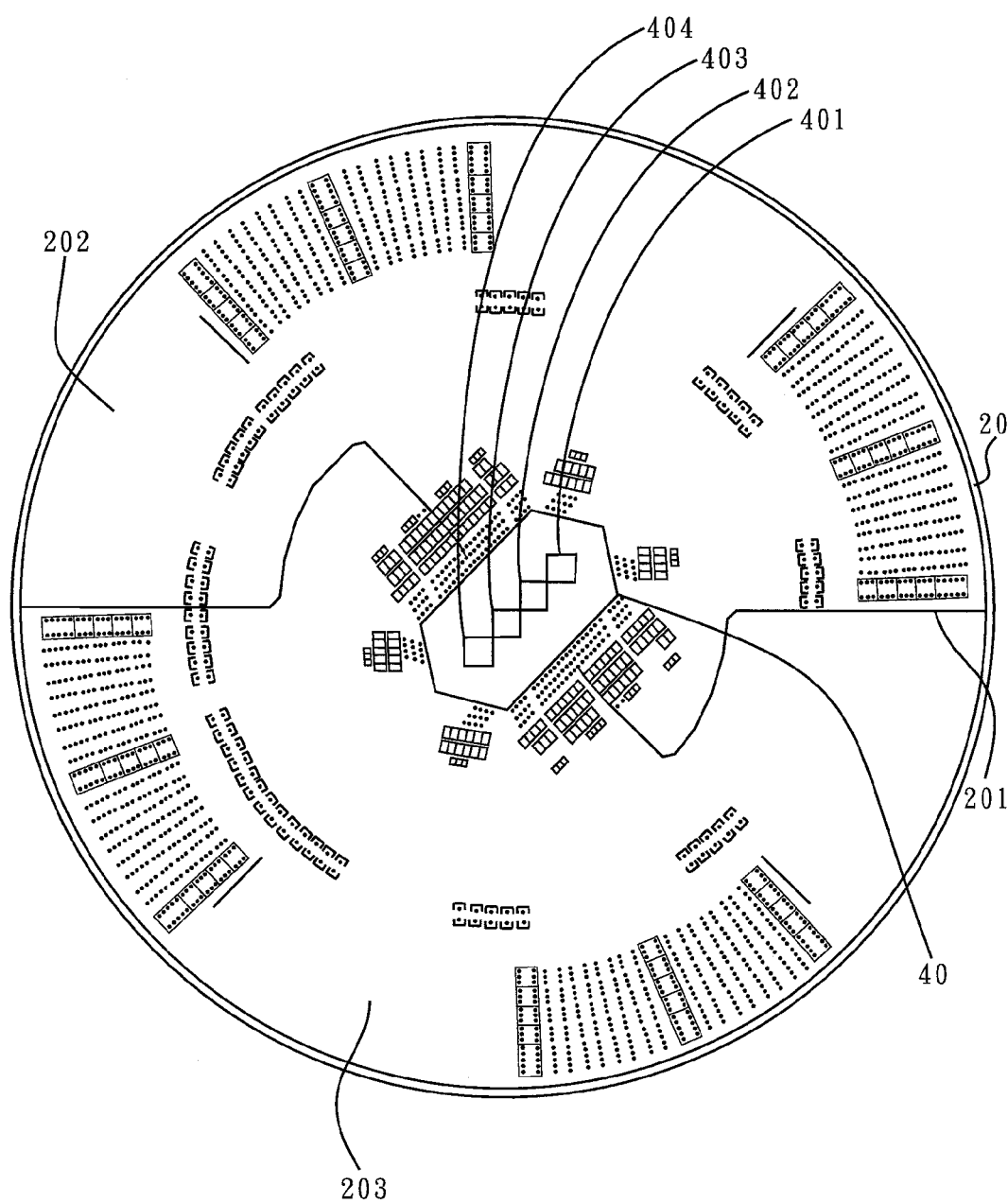
FIG. 2 shows an analog signal ground layer of multi-layer PCB of a parallel test fixture of the present invention for mixed signal integrated circuits.

Regarding to FIG. 2, FIG. 2 shows an analog signal ground layer of a multi-layer PCB of a parallel test fixture of the present invention for mixed signal ICs. In this embodiment of the present invention, the fixture is a load board, but should not be limited herein. The analog signal ground layer 20 comprises a test area 40 in the central area of the analog signal ground layer 20. In this embodiment, the test area 40 comprises a first test region 401, a second test region 402, a third test region 403, and a fourth test region 404. Then, the four test regions could accompany with four mixed signal ICs to parallel test.

In this embodiment, the circuit deposition of the analog signal ground layer 20 could be divided to a first analog signal ground region 202 and a second analog signal ground region 203 by a cut line 201. Then, an analog signal of the first test region 401 and an analog signal of the third test region 403 are operationally connected to circuit of the first analog signal ground region 202, and an analog signal of the second test region 402 and an analog signal of the fourth test region 404 are operationally connected to circuit of the second analog signal ground region 203. Because the crosstalk could be occurred if the analog signal of the first test region 401 and the analog signal of the second test region 402 are operationally connected to the first analog ground region 202, and the first test region 401 and the third test region 403 do not contact each other, the analog signal of the first test region 401 and the analog signal of the third test region 403 operationally connecting to the first analog signal ground region 202 do not produce the problems about crosstalk, vice versa. Therefore, the circuit deposition of the analog signal ground layer of the present invention could solve the problems about crosstalk. Moreover, only one analog signal ground layer is needed in the present invention.

Figure 3:
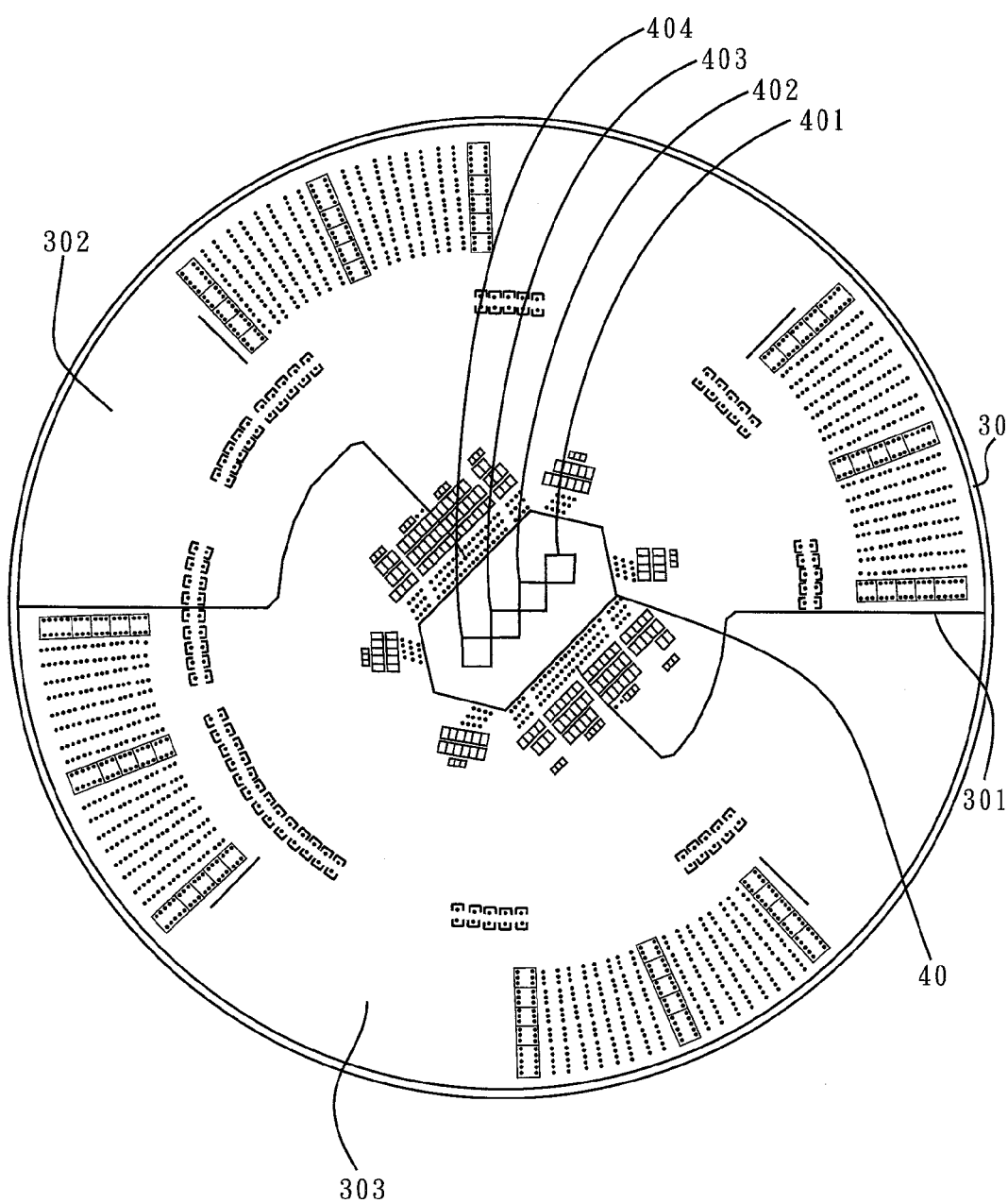
FIG. 3 shows a digital signal ground layer of multi-layer PCB of the parallel test fixture of the present invention for mixed signal integrated circuits.

FIG. 3 shows a digital signal ground layer of multi-layer PCB of the parallel test fixture of the present invention for mixed signal integrated circuits. The circuit deposition of the digital signal ground layer in FIG. 3 is similar to the circuit deposition of the analog signal ground layer in FIG. 2. The digital signal ground layer 30 comprises the test area 40 in the central area of the digital signal ground layer 30. In this embodiment, the test area 40 comprises a first test region 401, a second test region 402, a third test region 403, and a fourth test region 404. Then, the four test regions could accompany with four mixed signal ICs to parallel test.

In this embodiment, the circuit deposition of the digital signal ground layer 30 is similar to the circuit deposition of the analog signal ground layer 20 shown in FIG. 2. The circuit deposition of the digital signal ground layer 30 could be divided to a first digital signal ground region 302 and a second digital signal ground region 303 by a cut line 301. Then, an digital signal of the first test region 401 and an digital signal of the third test region 403 are operationally connected to circuit of the first digital signal ground region 302, and an digital signal of the second test region 402 and an digital signal of the fourth test region 404 are operationally connected to circuit of the second digital signal ground region 303. As the same reason as the circuit deposition of the analog signal ground layer in FIG. 2, the crosstalk could be occurred if the digital signal of the first test region 401 and the digital signal of the second test region 402 are operationally connected to the first digital ground region 302. Because the first test region 401 and the third test region 403 do not contact each other, the digital signal of the first test region 401 and the digital signal of the third test region 403 operationally connecting to the first digital signal ground region 302 do not produce the problems about crosstalk, vice versa. Therefore, the circuit deposition of the digital signal ground layer of the present invention could solve the problems about crosstalk. Moreover, only one digital signal ground layer is needed in the present invention.

As mentioned-above, the circuit deposition of ground layer of the multi-layer PCB of the fixture of the present invention could solve the problems about noise due to crosstalk. Moreover, only one analog signal ground layer and one digital signal ground layer are needed. Furthermore, the fixture of the present invention is not limited only for four mixed signal ICs to parallel test. As long as the test regions of the test area which do not contact each other, the analog signals of these regions could be operationally connected to the first analog signal ground region; and the analog signals of the other test regions which also do not contact each other could be operationally connected to the second analog signal ground region. Then, the problems about noise due to crosstalk could be solved, and only one analog signal ground layer is needed. Similarly, only one digital signal ground layer is needed, and the problems about noise due to crosstalk of the digital signals of the several mixed signal ICs also would be solved.

The circuit deposition of the multi-layer PCB of the fixture of the present invention comprises an analog signal layer, which is utilized to transfer analog signal, and the analog signal layer is operationally connected to an analog signal of the test area and an analog signal ground layer to form a circuit. Moreover, the test area comprises a plurality of test regions. Then, the test regions which do not contact each other, the analog signals of these regions could be operationally connected to the first analog signal ground region; the analog signals of the other test regions which also do not contact each other could be operationally connected to the second analog signal ground region. Moreover, the circuit deposition of the multi-layer PCB of the fixture of the present invention comprises a digital signal layer, which is utilized to transfer digital signal, and the digital signal layer is operationally connected to a digital signal of the test area and a digital signal ground layer to form a circuit. Then, the test regions of the test area which do not contact each other, the digital signals of these regions could be operationally connected to the first digital signal ground region; the digital signals of the other test regions which also do not contact each other could be operationally connected to the second digital signal ground region. Therefore, only one analog signal ground layer and one digital signal ground layer of the multi-layer PCB could be solved the problems about noise due to crosstalk. Thereby, the better electricity in the test process could be obtained, and the thickness of the multi-layer PCB could be reduced when the numbers of the ground layer are reduced effectively.

The specific arrangements herein are merely illustrative of the principles of this invention. Numerous modifications in form and detail may be made by those skilled in the art without departing from the true spirit and scope of the invention.

What is claimed is:

1. A parallel test fixture for mixed signal integrated circuit, wherein said fixture having a multi-layer printed circuit board, and said fixture comprising:
   a test area, which is disposed on a central area of the multi-layer printed circuit board and includes several test regions for a plurality of mixed signal integrated circuits, and includes a first test region, a second test region, a third test region, and a fourth test region for mixed signal integrated circuits;
   an analog signal ground layer, which is operationally connected with a plurality of analog signals of said mixed signal integrated circuits in the test area, and includes a first analog signal ground region and a second analog signal ground region; and
   a digital signal ground layer, which is operationally connected with a plurality of digital signals of said mixed signal integrated circuits in the test area, and includes a first digital signal ground region and a second digital signal ground region;
   wherein an analog signal of said second test region and an analog signal of said fourth test region operationally connecting to said second analog signal ground region, and a digital signal of said second test region and a digital signal of said fourth test region operationally connecting to said second digital signal ground region.

2. The fixture of claim 1, wherein said fixture comprises a load board.

3. The fixture of claim 1, wherein said fixture comprises a probe card.

4. A parallel test fixture for mixed signal integrated circuit, wherein said fixture having a multi-layer printed circuit board, and said fixture comprising:
   a test area, which is disposed on a central area of the multi-layer printed circuit board and includes test regions for a plurality of mixed signal integrated circuits, and includes a first test region, a second test region, a third test region, and a fourth test region which are deposited in said test area in order;
   an analog signal layer, which is one layer of the multi-layer printed circuit board for transforming analog signal, and operationally connecting to a plurality of analog signals of said test area;
   an analog signal ground layer, which is one layer of the multi-layer printed circuit board, and operationally connects with a plurality of analog signals of said analog signal layer and said test area to form a circuit, and includes a first analog signal ground region and a second analog signal ground region;
   a digital signal layer, which is one layer of the multi-layer printed circuit board for transforming digital signal, and operationally connecting to a plurality of digital signals of said test area; and
   a digital signal ground layer, which is one layer of the multi-layer printed circuit board, and operationally connects with a plurality of digital signals of said digital signal layer and said test area to form a circuit, and includes a first digital signal ground region and a second digital signal ground region;
   wherein an analog signal of said first test region and an analog signal of said third test region operationally connecting to said first analog signal ground region; and a digital signal of said first test region and a digital signal of said third test region operationally connecting to said first digital signal ground region.

5. The fixture of claim 4, wherein an analog signal of said second test region and an analog signal of said fourth test region operationally connecting to said second analog signal ground region; and a digital signal of said second test region and a digital signal of said fourth test region operationally connecting to said second digital signal ground region.

6. A parallel test fixture for mixed signal integrated circuit, and said fixture comprising:
   a test area, which is parallel tested to a plurality of mixed signal integrated circuits, and includes a first test region, a second test region, a third test region, and a fourth test region; and the first test region;
   a multi-layer printed circuit board having a central area to deposit said test area, and said multi-layer printed circuit board including: an analog signal ground layer operationally connecting to a plurality of analog signals of said mixed signal integrated circuits and includes a first analog signal ground region and a second analog signal ground region, and a digital signal ground layer operationally connecting to a plurality of digital signals of said mixed signal integrated circuits and includes a first digital signal ground region and a second digital signal ground region;
   wherein an analog signal of said first test region and an analog signal of said third test region operationally connecting to said first analog signal ground region, and an analog signal of said second test region and an analog signal of said fourth test region operationally connecting to said second analog signal ground region; and a digital signal of said first test region and a digital signal of said third test region operationally connecting to said first digital signal ground region, and a digital signal of said second test region and a digital signal of said fourth test region operationally connecting to said second digital signal ground region.

7. The fixture of claim 6, wherein said multi-layer printed circuit board further comprising an analog signal layer for transforming analog signal.

8. The fixture of claim 6, wherein said multi-layer printed circuit board further comprising a digital signal layer for transforming digital signal.

9. The fixture of claim 6, wherein the first test region, the second test region, the third test region, and the fourth test region are deposited in said test area in order.

10. The fixture of claim 6, wherein said fixture obtains the best effect of reducing crosstalk.

11. The fixture of claim 6, wherein numbers of said multi-layer printed circuit board is reduced.

* * * * *